US009331602B2

(12) United States Patent
Nagata et al.

(10) Patent No.: US 9,331,602 B2
(45) Date of Patent: May 3, 2016

(54) VIBRATOR, OSCILLATOR, ELECTRONIC DEVICE, AND MOVING OBJECT

(71) Applicant: Seiko Epson Corporation, Tokyo (JP)

(72) Inventors: Kazuyuki Nagata, Minowa (JP); Ryuji Kihara, Matsumoto (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/513,594

(22) Filed: Oct. 14, 2014

(65) Prior Publication Data

US 2015/0102865 A1   Apr. 16, 2015

(30) Foreign Application Priority Data

Oct. 15, 2013   (JP) ................... 2013-214422

(51) Int. Cl.
*H03B 5/30* (2006.01)
*H01L 41/053* (2006.01)
*H01L 41/083* (2006.01)
*H03H 9/24* (2006.01)
*H02N 1/00* (2006.01)
*H01L 41/09* (2006.01)
*H03H 9/02* (2006.01)

(52) U.S. Cl.
CPC .............. *H02N 1/006* (2013.01); *H01L 41/053* (2013.01); *H01L 41/083* (2013.01); *H01L 41/0913* (2013.01); *H03B 5/30* (2013.01); *H03H 9/02338* (2013.01); *H03H 9/2405* (2013.01); *H03H 9/2447* (2013.01); *H03H 2009/02283* (2013.01)

(58) Field of Classification Search
CPC ............ G04F 5/04; G04F 5/06; G04F 5/063; H01L 41/053; H01L 41/083; H01L 41/0913; H03B 5/30; H03B 5/32; H03H 9/17; H03H 9/172; H03H 9/21; H03H 9/215; H03H 9/24; H03H 9/2447
USPC ........... 310/311, 367, 370; 331/154, 156, 158
See application file for complete search history.

(56) References Cited

U.S. PATENT DOCUMENTS

| | | | |
|---|---|---|---|
| 4,540,909 A | 9/1985 | Takahashi et al. | |
| 5,533,397 A | 7/1996 | Sugitani et al. | |
| 5,691,595 A * | 11/1997 | Tomikawa et al. ............. | 310/370 |
| 5,847,487 A * | 12/1998 | Maeno ........................... | 310/321 |
| 6,097,135 A * | 8/2000 | Cappabianca ................. | 310/367 |
| 6,820,313 B2 * | 11/2004 | Gauchet ........................ | 29/25.35 |
| 7,043,986 B2 * | 5/2006 | Kikuchi et al. ............ | 73/504.12 |
| 7,215,061 B2 * | 5/2007 | Kihara et al. ................. | 310/309 |

(Continued)

FOREIGN PATENT DOCUMENTS

| | | |
|---|---|---|
| JP | 59-218025 A | 12/1984 |
| JP | 60-064516 A | 4/1985 |

(Continued)

*Primary Examiner* — Levi Gannon
(74) *Attorney, Agent, or Firm* — Harness, Dickey & Pierce, P.L.C.

(57) ABSTRACT

A MEMS vibrator includes: a substrate; a base portion which is disposed on the substrate; and a plurality of vibration portions which extends in a direction that intersects with a normal line of the substrate from the base portion. In a planar view, when a length of the vibration portion in a direction in which the vibration portion extends from the base portion is L, and a length of the vibration portion in a direction that intersects with a direction in which the vibration portion extends from the base portion is W, a dimension ratio (L/W) of the vibration portion satisfies a relationship in which $0.2 \leq (L/W) \leq 7.0$.

9 Claims, 12 Drawing Sheets

(56) References Cited

U.S. PATENT DOCUMENTS

| | | | |
|---|---|---|---|
| 7,521,846 B2* | 4/2009 | Tanaya | 310/370 |
| 2009/0102327 A1* | 4/2009 | Kawashima | H03B 5/36 |
| | | | 310/370 |
| 2011/0227457 A1* | 9/2011 | Ishikawa | H01L 41/047 |
| | | | 310/344 |
| 2011/0227660 A1* | 9/2011 | Mikami | 331/156 |
| 2012/0326571 A1* | 12/2012 | Shimura et al. | 310/370 |
| 2013/0320816 A1* | 12/2013 | Yamaguchi et al. | 310/367 |

FOREIGN PATENT DOCUMENTS

| | | |
|---|---|---|
| JP | 01-236808 | 9/1989 |
| JP | 04-348606 A | 12/1992 |
| JP | 05-014114 A | 1/1993 |
| JP | 07-113644 A | 5/1995 |
| JP | 07-128068 A | 5/1995 |

* cited by examiner

VIBRATOR, OSCILLATOR, ELECTRONIC DEVICE, AND MOVING OBJECT

BACKGROUND

1. Technical Field

The present invention relates to a vibrator, an oscillator provided with the vibrator, an electronic device, and a moving object.

2. Related Art

An electro-mechanical system structure (for example, a vibrator, a filter, a sensor, or a motor) provided with a mechanically movable structure which is called a micro electro mechanical system (MEMS) device which is formed by using semiconductor micro fabrication technology, is generally known. Among these, compared to a vibrator and a resonator using quartz crystal or a dielectric in the related art, since a MEMS vibrator is easy to be manufactured by incorporating a semiconductor circuit and advantageous in refinement and high functionality, the usage range thereof widens.

As representative examples of the MEMS vibrator in the related art, for example, a comb type vibrator which vibrates in a direction parallel to a substrate surface provided with the vibrator, or, for example, a beam type vibrator which vibrates in a thickness direction of the substrate, is known. The beam type vibrator is a vibrator which has a fixed electrode formed on the substrate or the movable electrode separated and disposed on the substrate, and according to a method of supporting a movable electrode, a cantilevered beam type (clamped-free beam), a double-end supported beam type (clamped-clamped beam), or a both-ends free beam type (free-free beam) is known.

In the MEMS vibrator in a cantilevered beam type in JP-A-2012-85085, in a side surface portion of a first electrode provided on a main surface of the substrate, a corner of the side surface portion provided on a supporting portion side of a movable second electrode is formed substantially perpendicularly. For this reason, it is possible to reduce an effect of the variation of a vibration characteristic caused by a variation in an electrode shape, and to obtain a stable vibration characteristic.

However, the MEMS vibrator in JP-A-2012-85085 is advantageous in that the size thereof can be reduced since there is one supporting portion. However, since the mass of the supporting portion which fixes the cantilevered beam is small, there is a problem in that a Q value deteriorates due to a vibration leakage in which flexural vibration of the beam is transmitted through the supporting portion and is leaked to the entire substrate, and in that a high Q value cannot be obtained and a stable vibration characteristic or a desired vibration characteristic cannot be obtained according to the deterioration of the Q value due to a thermoelastic loss generated by the supporting portion where the stress of flexural vibration is concentrated.

SUMMARY

An advantage of some aspects of the invention is to solve at least a part of the problems described above, and the invention can be implemented as the following forms or application examples.

APPLICATION EXAMPLE 1

This application example is directed to a vibrator including: a substrate; a base portion which is disposed on the substrate; and a vibration portion which extends in a direction that intersects with a normal line of the substrate from the base portion. In a planar view of the substrate, when a length of the vibration portion in a direction in which the vibration portion extends from the base portion is L, and a length of the vibration portion in a direction that intersects with a direction in which the vibration portion extends from the base portion is W, a dimension ratio (L/W) of the vibration portion satisfies a relationship in which $0.2 \leq (L/W) \leq 7.0$.

According to this application example, by setting the dimension ratio (L/W) of the vibration portion to be $0.2 \leq (L/W) \leq 7.0$, a thermoelastic loss which is generated when stress is concentrated which is displaced in the center of the width direction at a tip end portion of the vibration portion in a plate thickness direction, or a thermoelastic loss generated by the concentration of the stress between the adjacent vibration portions can be reduced. For this reason, it is possible to obtain a vibrator having a Q value higher than that of the vibrator with a cantilevered beam type structure in the related art, and having a stable vibration characteristic or a desired vibration characteristic.

APPLICATION EXAMPLE 2

This application example is directed to the vibrator according to the application example described above, which further includes: an electrode which faces the vibration portion and is spaced and disposed on the substrate.

According to this application example, when a fixed electrode is provided at a location facing the vibration portion and an AC voltage is applied between the vibration portion and fixed electrode, vibration portion is likely to occur in which the vibration portion is attracted to or pulled away from the fixed electrode. For this reason, it is possible to obtain a vibrator having a stable vibration characteristic.

APPLICATION EXAMPLE 3

This application example is directed to the vibrator according to the application example described above, wherein the dimension ratio (L/W) satisfies a relationship in which $0.5 \leq (L/W) \leq 1.0$.

According to this application example, by setting the dimension ratio (L/W) of a vibration portion 24 to be $0.5 \leq (L/W) \leq 1.0$, it is possible to obtain a vibrator having a Q value of 120000 or higher, and having a stable vibration characteristic or a desired vibration characteristic.

APPLICATION EXAMPLE 4

This application example is directed to the vibrator according to the application example described above, wherein the dimension ratio (L/W) satisfies a relationship in which $0.62 \leq (L/W) \leq 0.8$.

According to this application example, by setting the dimension ratio (L/W) of the vibration portion to be $0.62 \leq (L/W) \leq 0.8$, it is possible to obtain a vibrator having a Q value of 175000 or higher, and having a stable vibration characteristic or a desired vibration characteristic.

APPLICATION EXAMPLE 5

This application example is directed to the vibrator according to the application example described above, wherein the L dimension of the vibration portion is within a range of $5.0\ \mu m \leq L \leq 15.0\ \mu m$, and the length T of the vibration portion in a direction that intersects the substrate is within a range of $1.0\ \mu m \leq T \leq 2.0\ \mu m$.

According to this application example, by setting the length dimension L of the vibration portion to be within a range of 5.0 μm≤L≤15.0 μm, and the plate thickness dimension T of the vibration portion to be within a range of 1.0 μm≤T≤2.0 μm, it is possible to obtain a vibrator having a stable vibration characteristic, a low cost, and a Q value higher than that of the cantilevered beam type vibrator in the related art.

APPLICATION EXAMPLE 6

This application example is directed to the vibrator according to the application example described above, wherein the four vibration portions extend in a radial shape from the base portion.

According to this application example, since the four vibration portions extend in a radial shape from the base portion, when the adjacent vibration portions are displaced in different vertical directions from each other, the displacement in the vertical direction is offset in the base portion and the vibration is suppressed, and a state where the vibration displacement is not almost existent is achieved. For this reason, by supporting the base portion, it is possible to obtain a vibrator which has higher vibration efficiency and in which a vibration leakage is suppressed.

APPLICATION EXAMPLE 7

This application example is directed to the vibrator according to the application example described above, wherein a curved surface is provided between the adjacent vibration portions.

According to this application example, as the curved surface is provided between the adjacent vibration portions, it is possible to keep apart an interval between an area where a temperature generated by the concentration of the stress according to the vibration is high and an area where the temperature is low. For this reason, heat conduction is unlikely to occur, the thermoelastic loss is reduced, and it is possible to provide a vibrator having a higher Q value.

APPLICATION EXAMPLE 8

This application example is directed to the vibrator according to the application example described above, wherein the W dimension of the vibration portion is smaller at an end portion on a tip end of the vibration portion than at an end portion on the base portion.

According to this application example, since the width becomes smaller at the tip end side of the vibration portion, it is possible to suppress the concentration of the stress generated at the tip end side end portion of the vibration portion, and to reduce the thermoelastic loss according to the concentration of the stress. For this reason, it is possible to provide a vibrator having a high Q value.

APPLICATION EXAMPLE 9

This application example is directed to an oscillator including the vibrator according to the application example described above.

According to this application example, as the vibrator having a high Q value is provided, it is possible to provide an oscillator having higher functionality.

APPLICATION EXAMPLE 10

This application example is directed to an electronic device including the vibrator according to the application example described above.

According to this application example, as the vibrator having a high Q value is used as the electronic device, it is possible to provide an electronic device having higher functionality.

APPLICATION EXAMPLE 11

This application example is directed to a moving object including the vibrator according to the application example described above.

According to this application example, as the vibrator having a high Q value is used as the moving object, it is possible to provide a moving object having higher functionality.

BRIEF DESCRIPTION OF THE DRAWINGS

The invention will be described with reference to the accompanying drawings, wherein like numbers reference like elements.

FIG. 3A is a view illustrating that the dimension ratio (L/W) is in a range of 0 to 7.0. FIG. 3B is a view illustrating that the dimension ratio (L/W) is in a range of 0 to 2.0.

DESCRIPTION OF EXEMPLARY EMBODIMENTS

Hereinafter, an embodiment which implements the invention will be described with reference to the drawings. Hereinafter, an embodiment of the invention is described, and the invention is not limited thereto. In addition, in each drawing below, there is a case where the dimensions are different from the real dimensions for easy understanding.

Vibrator

First Embodiment

First, a MEMS vibrator 100 will be described as a vibrator according to a first embodiment of the invention.

Figure 1A:
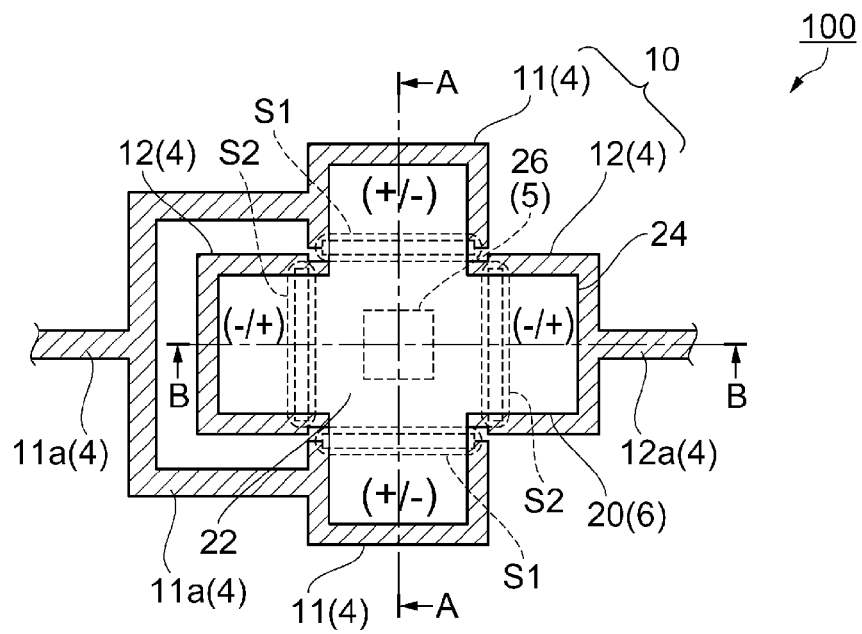
FIGS. 1A to 1C are plan views and cross-sectional views of a vibrator according to a first embodiment of the invention.
Figure 1B:
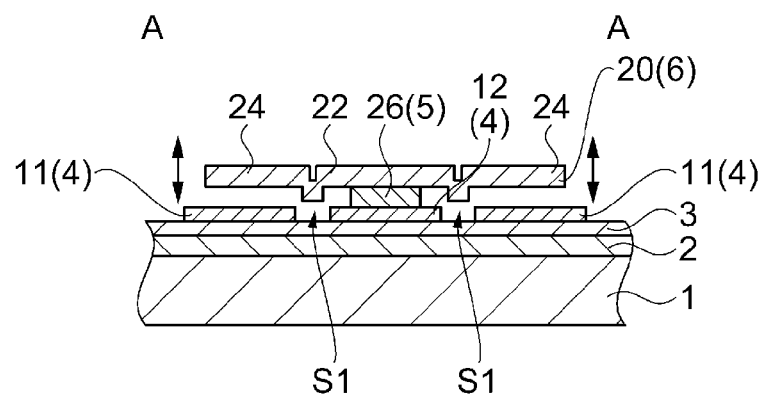
Figure 1C:
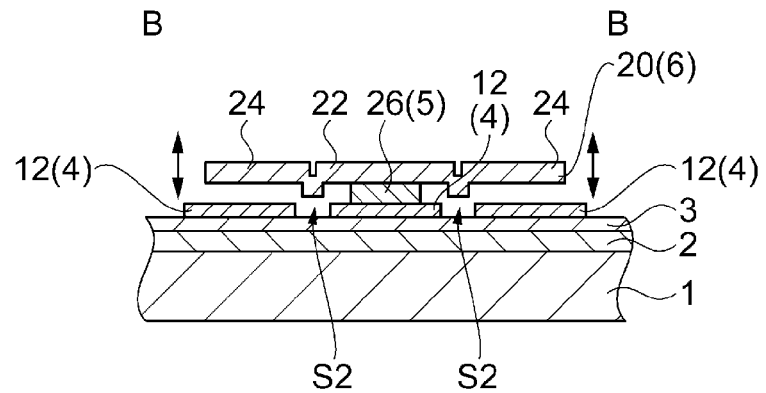

FIG. 1A is a plan view of the MEMS vibrator 100. FIG. 1B is a cross-sectional view along line A-A in FIG. 1A. FIG. 1C is a cross-sectional view along line B-B in FIG. 1A.

The MEMS vibrator 100 is an electrostatic beam type vibrator which is provided with a fixed electrode (lower electrode 10) formed on a substrate 1 and a movable electrode (upper electrode 20) formed to be separated from the substrate 1 and the fixed electrode. The movable electrode is formed to be separated from the substrate 1 and the fixed electrode as a sacrificing layer stacked on a main surface of the substrate 1 and the fixed electrode is etched thereon.

In addition, the sacrificing layer is a layer formed once by an oxide film or the like, and is removed by etching after forming a necessary layer above and below or in the vicinity thereof. As the sacrificing layer is removed, a necessary gap or a cavity is formed between each layer above and below or in the vicinity thereof, and a necessary structure is formed to be separated.

A configuration of the MEMS vibrator 100 will be described hereinafter. A manufacturing method of the MEMS vibrator 100 will be described in the embodiment which will be described below.

The MEMS vibrator 100 is configured to have the substrate 1, the lower electrode 10 (first lower electrode 11, second lower electrode 12) provided on the main surface of the substrate 1, a supporting portion 26 which is connected onto the substrate 1 via the lower electrode 10 (second lower electrode 12), an upper electrode 20 (integrated with the base portion 22 and a vibration portion 24) provided with a base portion 22 which is connected onto the supporting portion 26, and the like.

On the substrate 1, a silicon substrate is used as a suitable example. On the substrate 1, an oxide film 2 and a nitride film 3 are stacked in order. In an upper portion of the main surface side (surface of the nitride film 3) of the substrate 1, the lower electrode 10 (first lower electrode 11, second lower electrode 12), the supporting portion 26, the upper electrode 20, and the like, are formed.

In addition, here, in a thickness direction of the substrate 1, a direction in which the oxide film 2 and the nitride film 3 are stacked in order on the main surface of the substrate 1 is described as an upward direction.

In the lower electrode 10, the second lower electrode 12 is a fixed electrode which fixes the supporting portion 26 onto the substrate 1, imparts an electric potential to the upper electrode 20 via the supporting portion 26, and is formed as illustrated in FIG. 1A by patterning a first conductor layer 4 stacked on the nitride film 3 by photolithography (including etching processing. The same hereinafter). In addition, the second lower electrode 12 is connected with an outer circuit (not illustrated) by wiring 12a.

The supporting portion 26 is rectangular in a planar view, is overlapped with the base portion 22 of the upper electrode 20, and is connected to the surface of the side opposite to the substrate 1 of the base portion 22. In addition, the supporting portion 26 is disposed to be overlapped with the vibration node which is on the base portion 22. Furthermore, the supporting portion 26 is disposed at a center part of the second lower electrode 12. The supporting portion 26 is formed by patterning a second conductor layer 5 which is stacked on the first conductor layer 4 by photolithography. In addition, the first conductor layer 4 and the second conductor layer 5 use conductive polysilicon as a suitable example, respectively, but, the embodiment is not limited thereto.

The upper electrode 20 is configured to have the base portion 22 and a plurality of vibration portions 24 which extends in a direction that intersects with a normal line of the substrate 1 from the base portion 22. In particular, as illustrated in FIG. 1A, the upper electrode 20 is a movable electrode which forms a cross shape with the four vibration portions 24 that extend from the base portion 22 of the upper electrode 20, is supported by the supporting portion 26 provided under the base portion 22, and is separated from the substrate 1.

The upper electrode 20 is formed by patterning a third conductor layer 6 which is stacked on an upper layer of the second conductor layer 5 that forms the supporting portion 26 and an upper layer of the sacrificing layer stacked on the first conductor layer 4, by photolithography. In other words, the upper electrode 20 is integrally formed with the base portion 22 and the four vibration portions 24. In addition, center parts of the second lower electrode 12 and the cross-shaped upper electrode 20 are overlapped to be substantially matched with each other when the substrate 1 is viewed from a planar view, and the two vibration portions 24 which extend in a lateral direction (B-B direction) from the base portion 22 of the upper electrode 20 are disposed to be overlapped with the second lower electrode 12 (remove a part of a slit S2 which will be described later). In addition, the third conductor layer 6 uses conductive polysilicon as a suitable example, similarly to the first conductor layer 4 and the second conductor layer 5, but the embodiment is not limited thereto.

The lower electrode 10 which is the fixed electrode is disposed on the substrate 1 to be separated facing the vibration portion 24. In the lower electrode 10, the first lower electrode 11 is a fixed electrode to which an AC voltage is applied between the first lower electrode 11 and the upper electrodes 20 overlapped when the substrate 1 is viewed from a planar view, and is formed by patterning the first conductor layer 4 stacked on the nitride film 3 by photolithography. When FIG. 1A is viewed from a front view, the first lower electrode 11 is provided at two locations to be overlapped with the two vibration portions 24 which extend in a longitudinal direction (A-A direction) from the base portion 22 of the upper electrode 20, and are connected with the outer circuit (not illustrated) by wiring 11a.

The first lower electrode 11 is formed by the first conductor layer 4 which is the same layer as the second lower electrode 12. Therefore, the first lower electrode 11 is required to be electrically insulated between the first lower electrode 11 and the second lower electrode 12 as the fixed electrode which imparts the electric potential to the upper electrode 20, and each pattern (first lower electrode 11, second lower electrode 12) is separated. A step difference (unevenness) of a gap for the separation is transferred to the upper electrode 20 which is formed by the third conductor layer 6 stacked via the sacrificing layer stacked on the upper layer of the first conductor layer 4, in an uneven shape. In particular, as illustrated in FIGS. 1A and 1B, in a part of a separation portion (slit S1) of the pattern, the uneven shape is formed in the upper electrode 20.

In the MEMS vibrator 100, in order to prevent occurrence of a difference in stiffness by the vibration portion 24 which extends in the longitudinal direction (A-A direction) from the base portion 22 of the upper electrode 20 and the vibration portion 24 which extends in the lateral direction (B-B direction), a dummy slit pattern is provided in the second lower electrode 12. In particular, like the uneven shape reflected to the two vibration portions 24 in which the slit S1 extends in the longitudinal direction (A-A direction) of the upper electrode 20, a dummy slit S2 which generates the uneven shape in the two vibration portions 24 in which the slit S1 extends in the lateral direction (B-B direction) of the upper electrode 20, is provided in the second lower electrode 12 in which the slit S1 extends in the lateral direction (B-B direction) in an area where the upper electrode 20 is overlapped. In other words, a width of the slit S2 (length of B-B direction) is substantially the same as a width (length of A-A direction) of the slit S1. The slit S2 is formed so that a distance from a center point of the upper electrode 20 to the slit S2 is substantially the same as the distance from a center point of the upper electrode 20 to the slit S1, in a planar view.

As the dummy slit S2 is provided in this manner, the upper electrode 20 is configured to include an uneven portion. In addition, since the slit S2 is not formed for electrically insulating the second lower electrode 12, in a planar view, in the area where both end portions of the slit S2 which is not overlapped with the upper electrode 20, the second lower electrode 12 continues.

In the configuration, the MEMS vibrator 100 is configured as an electrostatic vibrator. By the AC voltage applied between the first lower electrode 11 and the upper electrode 20 via the wirings 11a and 12a from the outer circuit, a tip end area of the four vibration portions 24 of the upper electrode 20 vibrates as an antinode of the vibration. In FIG. 1A, a (+/−) signal illustrates a part which vibrates in a vertical direction (thickness direction of the substrate 1) as the antinode of the vibration, including a phase relationship of the vibration. In addition, the phases of the adjacent vibration portions 24 are different from each other. For example, the signal illustrates a case where the + vibration portion 24 moves in the upward direction (direction away from the substrate 1) and the adjacent vibration portion 24 moves in the − downward direction (direction which approaches the substrate 1). In other words, the upper electrode 20 which is the movable electrode vibrates in a direction which intersects with a plane surface including the lower electrode 10 (first lower electrode 11, second lower electrode 12) which is the fixed electrode.

Here, in the four vibration portions 24 which extend in a radial shape from the base portion 22, two vibration portions 24 which pinch the base portion 22 and extend in different directions from the base portion 22 are regarded as a beam of a substantially rectangular shape including the base portion 22. For this reason, flexural vibration is generated which has a displacement in the thickness direction of the vibration portion 24 in which the base portion 22 vibrates in the downward direction when the tip ends of the two vibration portions 24 vibrate in the upward direction. In addition, the adjacent vibration portions 24, the base portion 22, and the beam which is configured by the two vibration portions 24 which pinch the base portion 22 and extend in different directions from the base portion 22, and generate flexural vibration, in which the base portion 22 vibrates in the upward direction when the tip ends of the two vibration portions 24 vibrate in the downward direction. For this reason, when the two beams vibrate at the same time, the displacement of the base portion 22 in a vertical direction is offset and the vibration is suppressed, and the area facing a part which is connected between the center part of the base portion 22 and the adjacent vibration portion 24 is in a state where the vibration displacement rarely exists. By supporting the part, it is possible to more simply provide the electrostatic beam-shaped MEMS vibrator 100 in which the vibration efficiency is higher and the vibration leakage is suppressed.

Next, the Q value of the vibrator is generally determined by the vibration leakage which is a vibration energy leakage to the supporting portion, by a loss according to a viscosity of air, or by a loss caused by the heat which is the thermoelastic loss. In addition, the size of each loss is different according to the shape of the vibrator, a vibration mode, environment or the like, and it cannot be unconditionally said that which has the greatest influence on loss. Here, by vacuum-packaging the vibrator, the influence of the viscosity of air can be ignored. The vibration leakage can be reduced by optimizing the structure of the vibrator, and thus, by paying attention to the loss caused by the heat which is the thermoelastic loss and investigating a relationship between the structure of the vibrator and the thermoelastic loss, a structure of the vibrator which has low thermoelastic loss and high Q value has been considered.

The structure of the upper electrode 20 of the vibrator (MEMS vibrator 100) according to the embodiment, in particular, the relationship between the dimension ratio (L/W) of the vibration portion 24 and the $Q_{TED}$ value which is a Q value regarding only the thermoelastic loss will be described in detail based on FIGS. 2 to 5.

Figure 2:
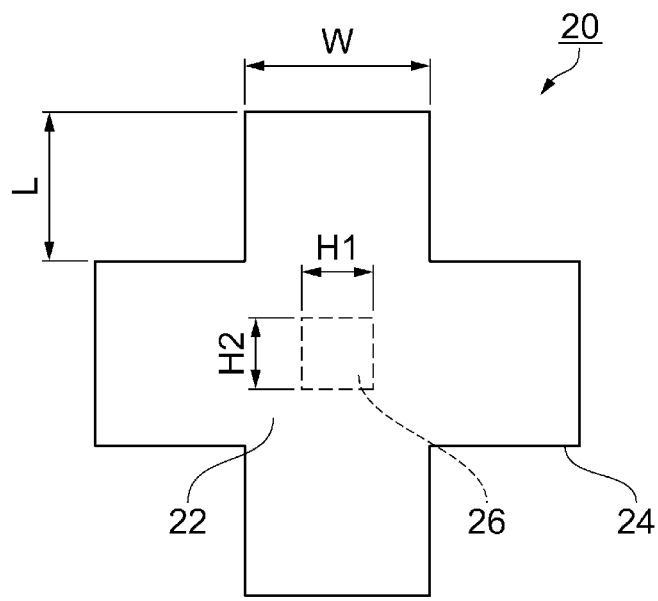
FIG. 2 is a plan view of an upper electrode of the vibrator which is used in calculating a $Q_{TED}$ value according to a thermoelastic loss.
Figure 3A:
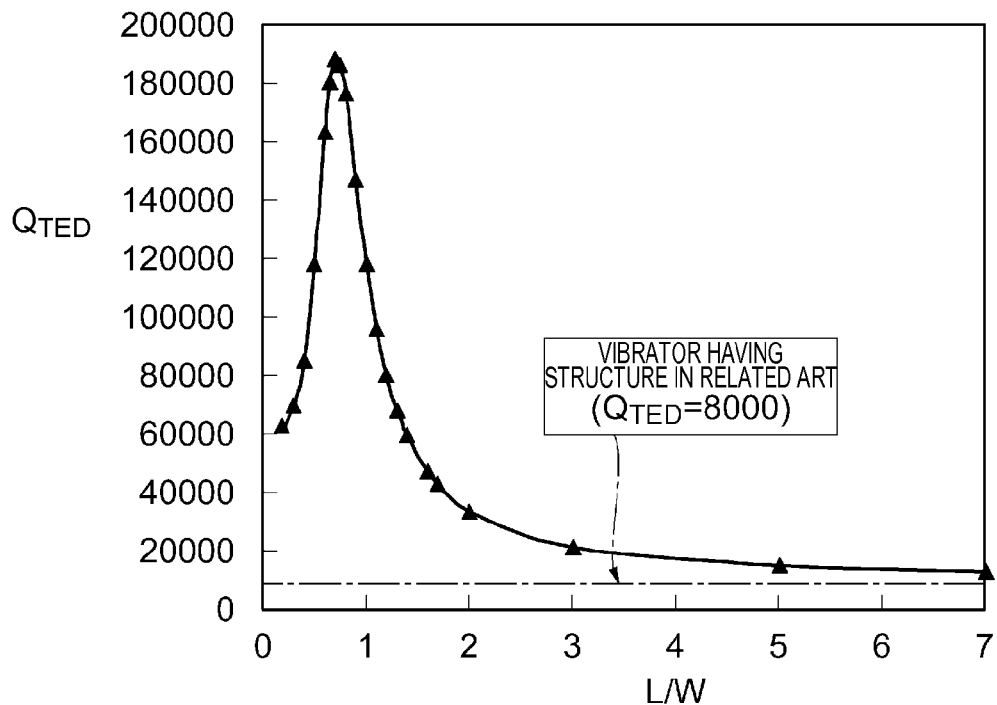
FIGS. 3A and 3B are views illustrating the $Q_{TED}$ value of the vibrator which is calculated by a finite element method with respect to a dimension ratio (L/W) of a vibration portion.
Figure 3B:
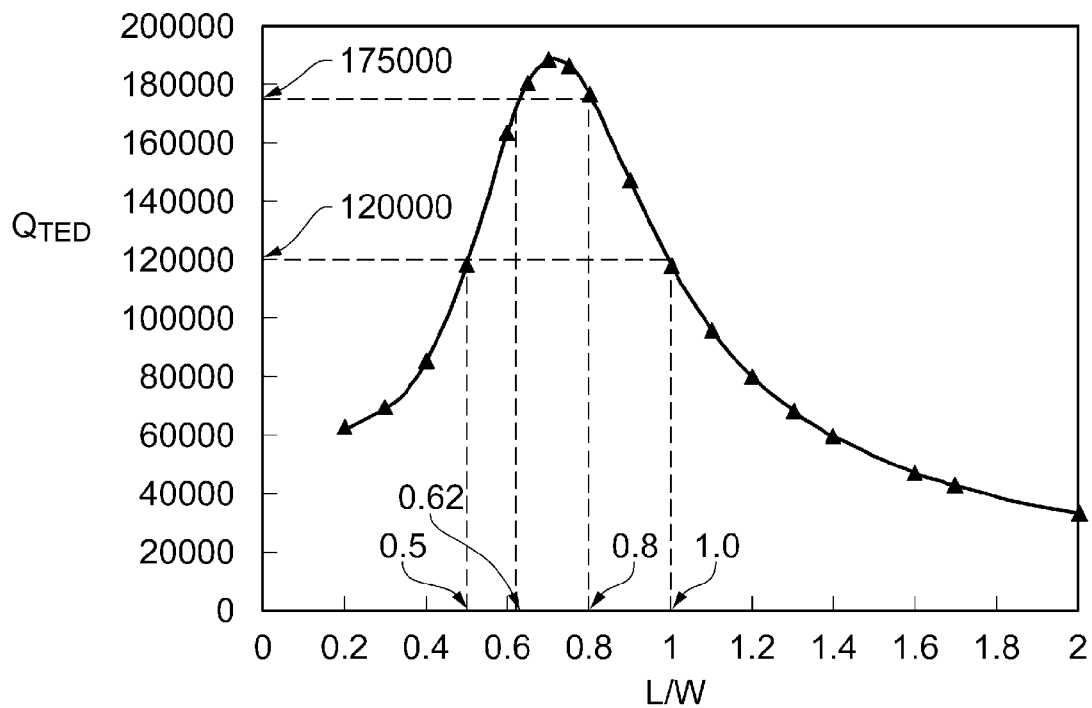

FIG. 2 is a plan view of an upper electrode of the vibrator which analyzes the $Q_{TED}$ value. In addition, FIGS. 3A and 3B are views illustrating the $Q_{TED}$ value of the vibrator calculated by the finite element method with respect to the dimension ratio (L/W) of the vibration portion. FIG. 3A is a view illustrating that the dimension ratio (L/W) is in a range of 0 to 7.0. FIG. 3B is an enlarged view illustrating that the dimension ratio (L/W) of FIG. 3A is in a range of 0 to 2.0.

In the upper electrode 20 of the vibrator illustrated in FIG. 2, the length dimension L in the direction in which the vibration portion 24 extends from the base portion 22, the length dimension (width direction) W in the direction that intersects with the direction in which the vibration portion 24 extends from the base portion 22, and the $Q_{TED}$ value of the vibrator with respect to the dimension ratio (L/W), are calculated. In addition, by setting the L of the vibration portion 24 to be 7.12 μm, the length dimension (plate thickness dimension) T of the direction that intersects with the substrate of the vibration portion 24 to be 1.3 μm, and the length dimensions H1 and H2 of the supporting portion 26 respectively to be 1 μm, and by changing the W of the vibration portion 24 to 1.02 μm to 35.6 μm (corresponds to 0.2 to 7.0 of dimension ratio (L/W)), each $Q_{TED}$ value can be calculated. The calculation result is illustrated in FIGS. 3A and 3B. In addition, in the vibrator having a cantilevered beam structure in the related art, by setting the L dimension of the vibration portion 24 to be 10.0 μm, the W dimension to be 14.29 μm, and the T dimension to be 1.3 μm, the length dimension of a part which corresponds to the base portion 22 in FIG. 2 being 20.0 μm, the width dimension to be 14.29 μm, and the plate thickness dimension to be 1.3 μm, the $Q_{TED}$ value can be calculated under a condition in which the entire surface of one main surface is fixed. The calculated $Q_{TED}$ value of the vibrator is approximately 8000.

In FIG. 3A, in the entire range where the calculated dimension ratio (L/W) is 0.2 to 7.0, it is apparent that the $Q_{TED}$ value greatly exceeds the $Q_{TED}$ value (approximately 8000) of the vibrator having a cantilevered beam structure in the related art and is the maximum which is approximately 190000 as the dimension ratio (L/W) is approximately near 0.7.

Therefore, by setting the dimension ratio (L/W) of the vibration portion 24 illustrated in FIG. 2 to be $0.2 \le (L/W) \le 7.0$, it is possible to obtain a MEMS vibrator 100 which has a high Q value which greatly exceeds the $Q_{TED}$ value (approximately 8000) of the vibrator having a cantilevered beam structure in the related art.

In FIG. 3A, the vibration portion 24 of the vibrator which has a dimension ratio (L/W) smaller than approximately 0.7 which is a dimension ratio (L/W) in which the $Q_{TED}$ value is the maximum, has a form in which the W dimension is extremely large with respect to dimension L. For this reason, the stress which is displaced in the center of the width direction in the tip end portion of the vibration portion 24 in the plate thickness direction is concentrated, and the thermoelastic loss is generated due to the concentration of the stress. Accordingly, it is considered that the $Q_{TED}$ value deteriorates. In addition, the vibration portion 24 of the vibrator which has a dimension ratio (L/W) greater than approximately 0.7 has a form in which the L dimension is extremely large with respect to dimension W. For this reason, the stress is concentrated between the adjacent vibration portions 24, and the thermoelastic loss is generated due to the concentration of the stress. Accordingly, it is considered that the $Q_{TED}$ value deteriorates.

In FIG. 3B, by setting the dimension ratio (L/W) of the vibration portion 24 to be $0.5 \le (L/W) \le 1.0$, it is possible to obtain a MEMS vibrator 100 having a $Q_{TED}$ value of 120000 or higher. Furthermore, by setting the dimension ratio (L/W) of the vibration portion 24 to be $0.62 \le (L/W) \le 0.8$, it is possible to obtain a MEMS vibrator 100 having a $Q_{TED}$ value of 175000 or higher.

Figure 4:
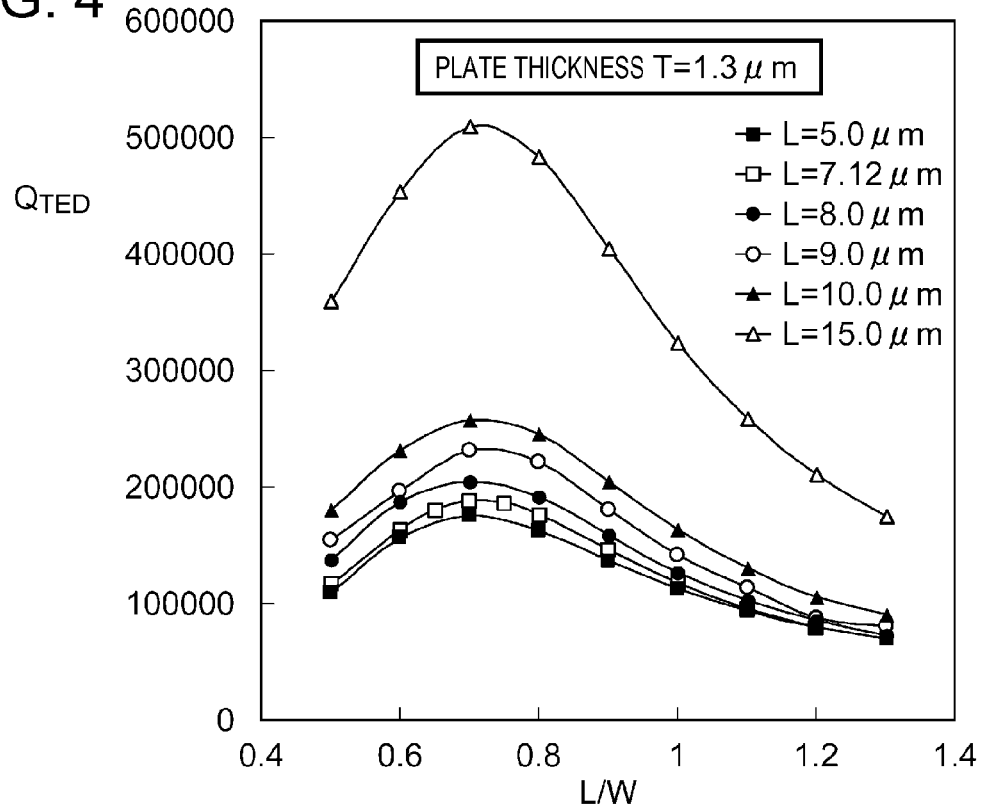
FIG. 4 is a view illustrating the $Q_{TED}$ value of the vibrator which is calculated by the finite element method with respect to the dimension ratio (L/W) of the vibration portion, according to a change in a length L of the vibration portion.

Next, the $Q_{TED}$ value of the vibrator with respect to the dimension ratio (L/W) of the vibration portion 24 in a case where the length dimension L of the vibration portion 24 is changed, will be described. FIG. 4 is a view illustrating the $Q_{TED}$ value calculated by the finite element method with respect to the dimension ratio (L/W) in a case where the L of the vibration portion is changed to be in a range of 5.0 μm to 15.0 μm.

In FIG. 4, even when the L dimension of the vibration portion 24 is changed, the maximum $Q_{TED}$ value in each L has approximately 0.7 in the dimension ratio (L/W). When the L dimension is smaller, the $Q_{TED}$ value tends to deteriorate. Therefore, in the shape of the upper electrode 20 of the embodiment, even when the L dimension of the vibration portion 24 is changed, it is possible to minimize the thermoelastic loss when the dimension ratio (L/W) of the vibration portion 24 is approximately 0.7, and to obtain the maximum $Q_{TED}$ value.

In addition, when the L dimension of the vibration portion 24 is smaller than 5.0 μm, there is a concern that the $Q_{TED}$ value is smaller than 150000, and it is difficult to obtain a stable vibration characteristic. In addition, when the L of the vibration portion 24 is greater than 15.0 μm, the length from the base portion 22 is extremely long in FIG. 2. For this reason, when the sacrificing layer which is used for separating the interval between the vibration portion 24 and the substrate is removed, a meniscus force works according to a surface tension of an etchant of the sacrificing layer, and there is a concern that a sticking phenomenon in which the vibration portion 24 adheres to the substrate is generated. Accordingly, by setting the L dimension of the vibration portion 24 to be in a range of 5.0 μm to 15.0 μm, it is possible to suppress the deterioration of the $Q_{TED}$ value, to have a high reliability in which the sticking phenomenon is reduced, and to obtain a MEMS vibrator 100 which has a $Q_{TED}$ value higher than the $Q_{TED}$ value (approximately 8000) of the above-described vibrator having a cantilevered beam structure in the related art.

Figure 5:
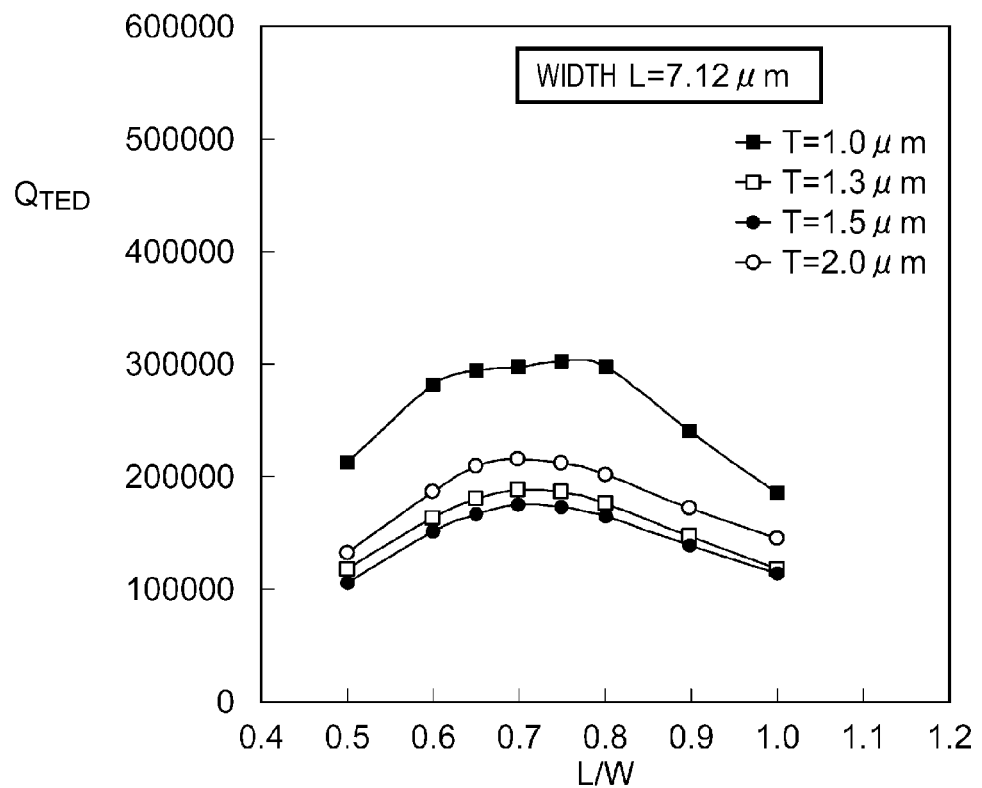
FIG. 5 is a view illustrating the $Q_{TED}$ value of the vibrator which is calculated by the finite element method with respect to the dimension ratio (L/W) of the vibration portion, according to a change in a plate thickness T of the vibration portion.

Next, the $Q_{TED}$ value of the vibrator with respect to the dimension ratio (L/W) of the vibration portion 24 in a case where the plate thickness dimension T of the vibration portion 24 is changed, will be described. FIG. 5 is a view illustrating the $Q_{TED}$ value calculated by the finite element method with respect to the dimension ratio (L/W) in a case where the plate thickness dimension T of the vibration portion is changed to be in a range of 1.0 μm to 2.0 μm.

In FIG. 5, even when the T dimension of the vibration portion 24 is changed, the maximum $Q_{TED}$ value in each T dimension is approximately 0.7 as the dimension ratio (L/W), the $Q_{TED}$ value deteriorates when the T dimension is smaller, and the T dimension is the minimum 1.5 μm. After that, the $Q_{TED}$ value tends to increase. Therefore, similarly to a case where the L dimension of the vibration portion 24 is changed, in the shape of the upper electrode 20 of the embodiment, even when the T dimension of the vibration portion 24 is changed, it is possible to minimize the thermoelastic loss when the dimension ratio (L/W) of the vibration portion 24 is approximately 0.7, and to obtain the maximum $Q_{TED}$ value.

In addition, when the T dimension of the vibration portion 24 is smaller than 1.0 μm, there is a concern that the vibration portion 24 is destroyed due to the AC voltage applied to the upper electrode 20 in FIGS. 1A to 1C and the lower electrode 10 (first lower electrode 11, second lower electrode 12) provided on the substrate 1. For this reason, in order to avoid the destruction of the vibration portion 24, it is required that the applied AC voltage be small, and there is a problem in that it is not possible to obtain a stable vibration characteristic since it is not possible to apply the AC voltage for performing a stable vibration. In addition, as the T dimension of the vibration portion 24 is greater than 2.0 μm, in manufacturing, it takes a lot of time and it is difficult to have a necessary elaborate conductor layer for obtaining a stable vibration characteristic, and there is difficulty in stabilizing the vibration characteristic and lowering the cost of the vibrator. Accordingly, by setting the T dimension of the vibration portion 24 to be in a range of 1.0 μm to 2.0 μm, it is possible to obtain a MEMS vibrator 100 which has a stable vibration characteristic and high reliability, a low cost, and a $Q_{TED}$ value higher than the $Q_{TED}$ value (approximately 8000) of the above-described vibrator having a cantilevered beam structure in the related art.

Above, in FIGS. 4 and 5, by setting the length dimension L of the vibration portion 24 to be in a range of $5.0\ \mu m \le L \le 15.0$ μm, and the plate thickness dimension T of the vibration portion to be in a range of $1.0\ \mu m \le T \le 2.0\ \mu m$, it is possible to obtain a MEMS vibrator 100 which has a stable vibration characteristic, a low cost, and a $Q_{TED}$ value higher than the $Q_{TED}$ value (approximately 8000) of the above-described vibrator having a cantilevered beam structure in the related art.

Manufacturing Method

Next, a manufacturing method of the vibrator (MEMS vibrator 100) according to the embodiment will be described. In addition, according to the description, the same configuration location described above will use the same reference numerals and the repeating description thereof will be omitted.

FIGS. 6A to 6F and FIGS. 7G to 7K are flow charts illustrating the manufacturing process of the MEMS vibrator 100 in order. States of the MEMS vibrator 100 in each process will be illustrated in the cross-sectional view taken along line A-A in FIG. 1A.

Figure 6A:
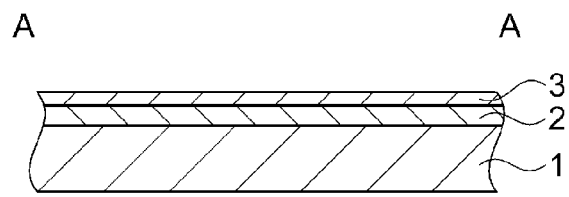
FIGS. 6A to 6F are flow charts illustrating the manufacturing process of the vibrator in order according to the embodiment.

FIG. 6A: The substrate 1 is prepared and the oxide film 2 is stacked on the main surface. The oxide film 2 is formed by a general local oxidation of silicon (LOCOS) as an element separation layer in a semiconductor process, but may be an oxide film according to generation of the semiconductor process, for example, according to a shallow trench isolation (STI) method.

Next, the nitride film 3 is stacked as an insulating layer. Silicon nitride ($Si_3N_4$) forms the nitride film 3 by a low pressure chemical vapor deposition (LPCVD). The nitride film 3 has a resistance with respect to buffered hydrogen fluoride as the etchant which is used at a time of release etching of a sacrificing layer 8 (refer to FIG. 7G) which will be described later, and functions as an etching stopper.

Figure 6B:
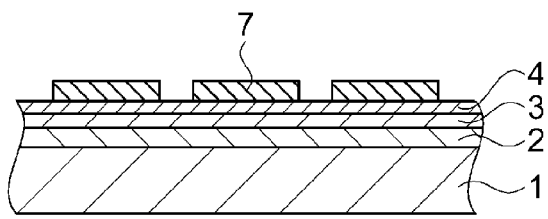
Figure 6C:
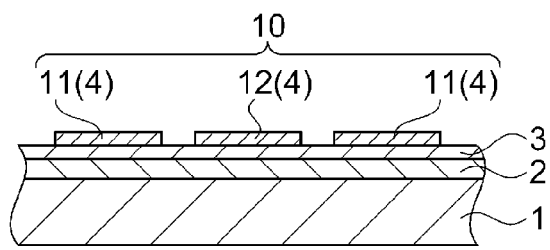

FIGS. 6B and 6C: Then, as a first layer forming process, first of all, the first conductor layer 4 is stacked on the nitride film 3. The first conductor layer 4 is a polysilicon layer which is configured to have the lower electrode 10 (first lower electrode 11, second lower electrode 12), the wirings 11a and 12a (refer to FIG. 1A), or the like, and has a predetermined conductivity by injecting ions, such as boron (B) or phosphorus (P) after the stacking. Next, by coating a resist 7 on the first conductor layer 4 and patterning by photolithography, the first lower electrode 11, the second lower electrode 12, and the wirings 11a and 12a are formed. In the first layer forming process, when the substrate 1 is viewed from a planar view after a third layer forming process, the lower electrode 10 is formed in advance to be overlapped with the upper electrode 20, in other words, the first lower electrode 11 and the second lower electrode 12 are formed.

Figure 6D:
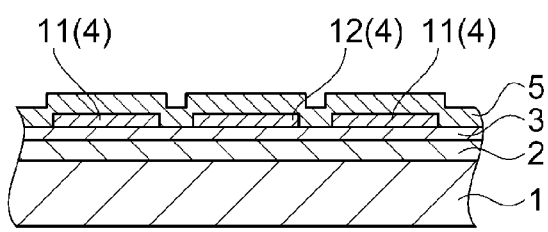

FIG. 6D: Next, as a second layer forming process, the second conductor layer 5 is stacked to cover the lower electrode 10 and the wirings 11a and 12a. The second conductor layer 5 is a polysilicon layer which constitutes the supporting portion 26, and has the predetermined conductivity by injecting ions, such as boron (B) or phosphorus (P) after the stacking.

Figure 6E:
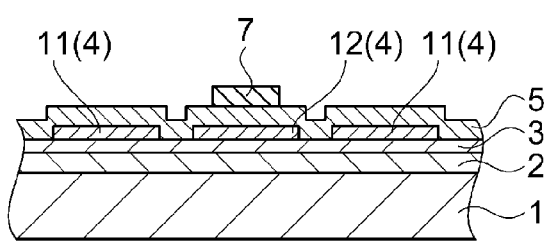
Figure 6F:
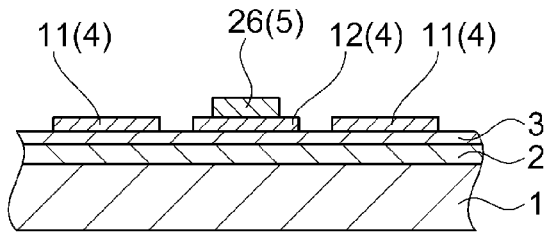

FIGS. 6E and 6F: Next, the resist 7 is coated on the second conductor layer 5, and by patterning by photolithography, the supporting portion 26 is formed. The supporting portion 26 forms a gap in the first lower electrode 11, the second lower electrode 12, and the upper electrode 20, separates the upper electrode 20, and is formed to be overlapped in the center part of the second lower electrode 12.

Figure 7G:
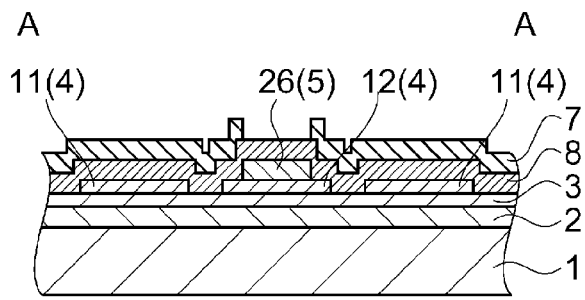
FIGS. 7G to 7K are flow charts illustrating the manufacturing process of the vibrator in order according to the embodiment.
Figure 7H:
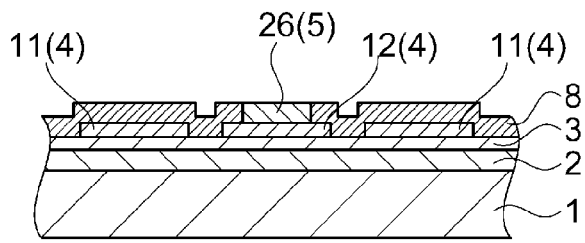

FIGS. 7G and 7H: Next, a sacrificing layer 8 is stacked to cover the lower electrode 10, the wirings 11a and 12a, and the supporting portion 26. The sacrificing layer 8 forms the gap between the first lower electrode 11 and the second lower electrode 12, and the upper electrode 20, is a sacrificing layer for separating the upper electrode 20, and forms a film using the chemical vapor deposition (CVD) method. On the stacked sacrificing layer 8, an unevenness caused by a step difference of the patterned first lower electrode 11 or second lower electrode 12 appears. Then, the resist 7 is coated on the sacrificing layer 8, and the sacrificing layer 8 on the supporting portion 26 is removed after the patterning by photolithography.

Figure 7I:
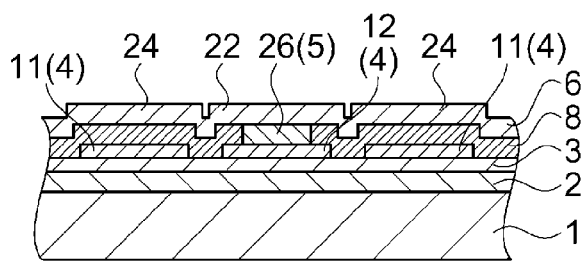
Figure 7J:
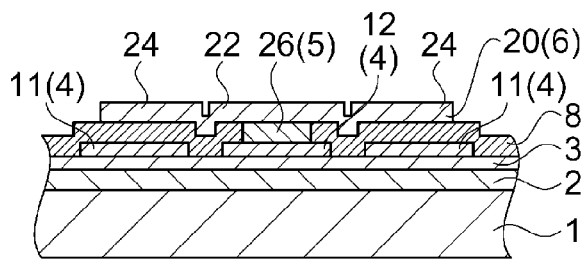

FIGS. 7I and 7J: Next, as the third layer forming process, first of all, the third conductor layer 6 is stacked to cover the sacrificing layer 8 and the supporting portion 26. The third conductor layer 6 is a polysilicon layer which is the same as the first conductor layer 4 or the second conductor layer 5, and has the predetermined conductivity by injecting ions, such as boron (B) or phosphorus (P) after the stacking. After that, by patterning by photolithography, the upper electrode 20 (base portion 22 and vibration portion 24) is formed. As illustrated in FIG. 1A, as an electrode which has an area that overlaps the first lower electrode 11 and the second lower electrode 12 when the substrate 1 is viewed from a planar view, the upper electrode 20 is formed in a shape such that the vibration portions 24 extend in a radial shape from the base portion 22 of the center of the upper electrode 20.

Figure 7K:
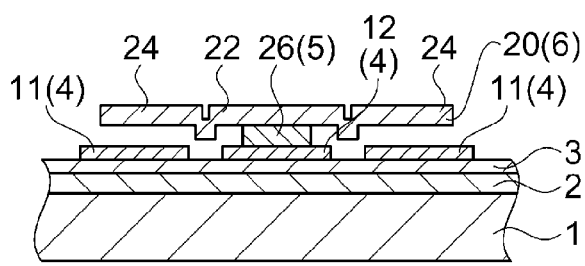

FIG. 7K: Next, by bleaching the substrate 1 by the etchant (buffered hydrogen fluoride) and etching-removing (release etching) the sacrificing layer 8, the gap between the first lower electrode 11 and the second lower electrode 12, and the upper electrode 20 is formed, and the upper electrode 20 is separated.

According to the description above, the MEMS vibrator 100 is formed.

In addition, it is preferable that the MEMS vibrator 100 is disposed in a cavity portion which is sealed in a decompression state. For this reason, in manufacturing the MEMS vibrator 100, the sacrificing layer for forming the cavity portion, a side wall portion which surrounds the sacrificing layer, a sealing layer which forms a lid of the cavity portion, or the like, is formed to be combined, but the description thereof is omitted here.

In addition, the invention is not limited to the above-described embodiment, and various modifications or improvements are possible to be added to the above-described embodiment. Modification examples will be described hereinafter. Here, the same configuration part as the above-described embodiment will use the same reference numerals and the repeated description thereof will be omitted.

Modification Example 1

Next, FIGS. 8A to 8D are plan views illustrating an example of a variation of the upper electrode in a vibrator (MEMS vibrator 100) according to Modification Example 1.

In the embodiment, as illustrated in FIG. 1A, the upper electrode 20 is described as the upper electrode 20 which forms a cross shape with the four vibration portions 24 that extend from the base portion 22. However, the configuration is not limited thereto. The number of vibration portions 24 may be an even number or an odd number, and four or more upper electrodes 20 may be formed.

Figure 8A:
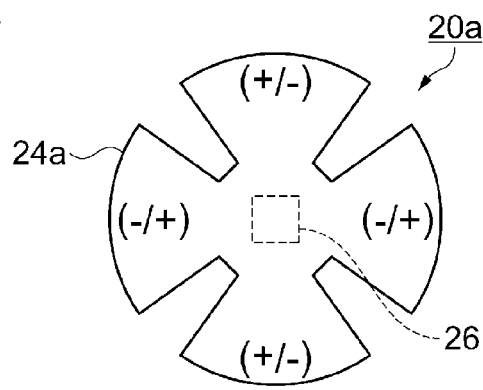
FIGS. 8A to 8D are plan views illustrating an example of a variation of an upper electrode in a vibrator according to Modification Example 1.

FIG. 8A is an example illustrating an upper electrode 20a configured in a disc shape. When the vibration occurs such that phases of the vibration of vibration portions 24a adjacent to each other are reversed, it is possible to provide a MEMS vibrator 100 having a high Q value in which the deterioration of the vibration efficiency and the vibration leakage are suppressed.

Figure 8B:
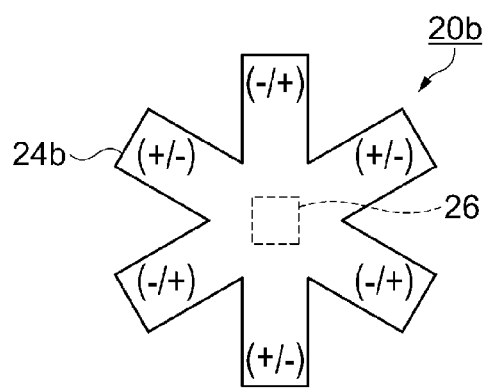

FIG. 8B is an example illustrating an upper electrode 20b having six vibration portions 24b. When the vibration occurs such that phases of the vibration of the vibration portions 24b adjacent to each other are reversed, it is possible to provide a MEMS vibrator 100 having a high Q value in which the deterioration of the vibration efficiency and the vibration leakage are suppressed.

Figure 8C:
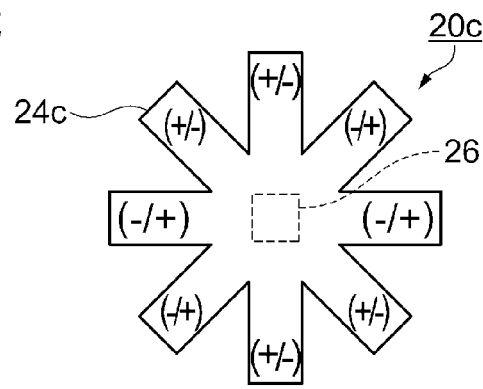

FIG. 8C is an example illustrating an upper electrode 20c having eight vibration portions 24c. When the vibration occurs such that phases of the vibration of the vibration portions 24c adjacent to each other are reversed, or when two vibration portions 24c adjacent to each other vibrate as one group in the same phase as illustrated in FIG. 8C, and the vibration occurs such that the phases of the vibration of the adjacent groups are reversed, it is possible to provide a MEMS vibrator 100 having a high Q value in which the deterioration of the vibration efficiency and the vibration leakage are suppressed.

Figure 8D:
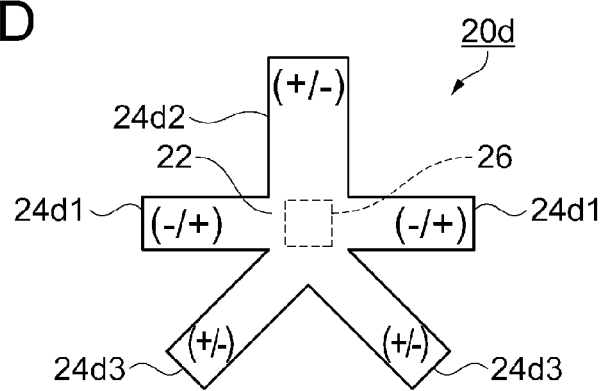

FIG. 8D is an example illustrating an upper electrode 20d having five vibration portions 24d1 to 24d3. A vibration portion 24d2 and two vibration portions 24d3 which pinch the base portion 22 at a facing position have different lengths (length in a width direction) of a direction which intersects a direction that extends from the base portion 22, and the length of a width direction of the vibration portion 24d2 is relatively longer than the length of a width direction of the two vibration portions 24d3. This is done to balance the vibration of the entire upper electrode 20d in which the base portion 22 and the vibration portions 24d1, 24d2, and 24d3 are integrated in a vibration node. By this configuration, even when the total number of the vibration portions 24d1, 24d2, and 24d3 is an odd number, it is possible to provide a MEMS vibrator 100 having a high Q value in which the deterioration of the vibration efficiency and the vibration leakage are suppressed.

Second Embodiment

Next, a vibrator according to a second embodiment of the invention will be described with reference to FIG. 9.

Figure 9:
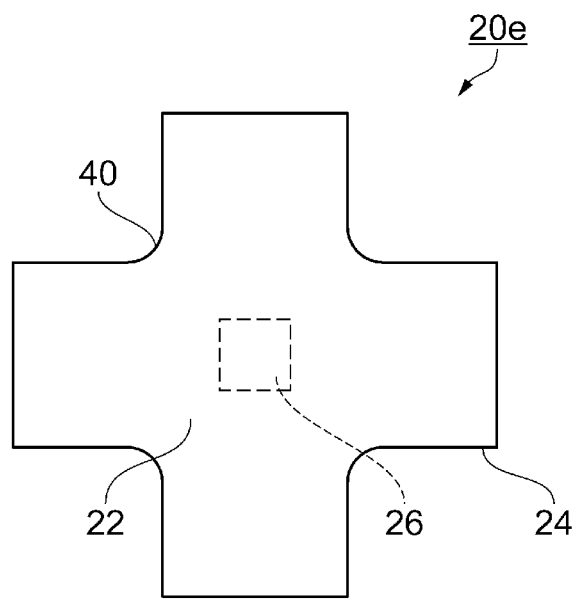
FIG. 9 is a plan view of the upper electrode of the vibrator according to a second embodiment of the invention.

FIG. 9 is a plan view of the upper electrode of the vibrator according to the second embodiment of the invention.

Hereinafter, an upper electrode 20e of the vibrator according to the second embodiment will be described, focusing on points different from the above-described first embodiment. In addition, in a similar configuration, the same reference numerals are used, and the description of similar items will be omitted.

As illustrated in FIG. 9, the upper electrode 20e according to the second embodiment is provided with the curved surface 40 between the adjacent vibration portions 24. By the configuration, as the stress according to the vibration is concentrated, it is possible to keep apart the interval between an area where the generated temperature is high and an area where the temperature is low. For this reason, the heat conduction is unlikely to occur, and it is possible to reduce the thermoelastic loss, and to provide a MEMS vibrator 100 having a high Q value.

Third Embodiment

Next, a vibrator according to a third embodiment of the invention will be described with reference to FIG. 10.

Figure 10:
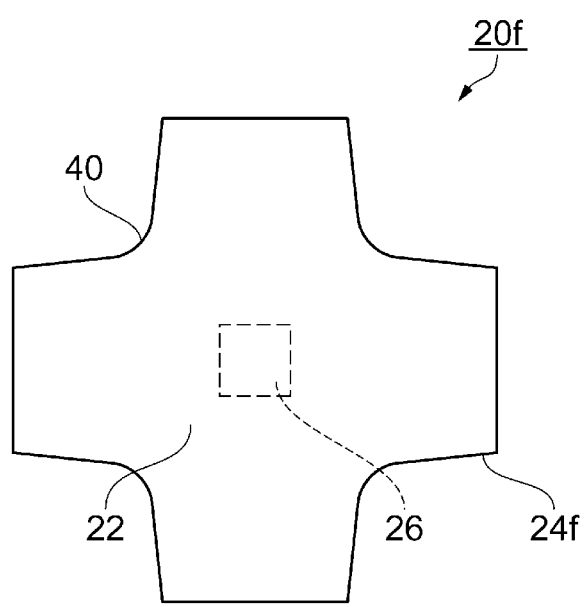
FIG. 10 is a plan view of the upper electrode of the vibrator according to a third embodiment of the invention.

FIG. 10 is a plan view of the upper electrode of the vibrator according to the third embodiment of the invention.

Hereinafter, an upper electrode 20f of the vibrator according to the third embodiment will be described, focusing on points different from the above-described first embodiment. In addition, in a similar configuration, the same reference numerals are used, and the description of similar items will be omitted.

As illustrated in FIG. 10, the upper electrode 20f according to the third embodiment is provided as a shape in which the width of an end portion on a tip end is smaller than that of an end portion on the base portion 22, that is, a vibration portion 24f of which a bottom side of a trapezoidal shape is connected to the base portion 22. As the width of the tip end side of the vibration portion 24f becomes narrow, it is possible to suppress the concentration of the stress generated by the tip end side end portion of the vibration portion 24f, and to reduce the thermoelastic loss according to the concentration of the stress. For this reason, it is possible to provide a MEMS vibrator 100 having a high Q value.

Above, in the vibrator according to the first embodiment in FIG. 1A, the vibrator according to Modification Example 1 in FIGS. 8A to 8D, the vibrator according to the second embodiment in FIG. 9, and the vibrator according to the third embodiment in FIG. 10, the shape of the supporting portion 26 provided in the center part of the base portion 22 is configured to be rectangular. However, the configuration is not limited thereto, and may be a polygon, a circle, or a cross. In addition, one supporting portion 26 is provided, but the invention is not limited thereto, and a plurality of supporting portions 26 may be provided.

Fourth Embodiment

Next, a vibrator according to a fourth embodiment of the invention will be described with reference to FIG. 11.

Figure 11:
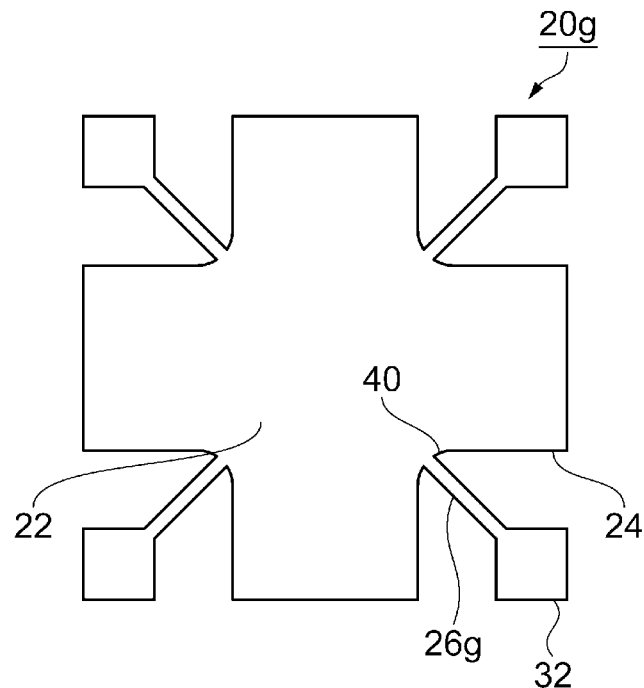
FIG. 11 is a plan view of the upper electrode of the vibrator according to a fourth embodiment of the invention.

FIG. 11 is a plan view of the upper electrode of the vibrator according to the fourth embodiment of the invention.

Hereinafter, an upper electrode 20g of the vibrator according to the fourth embodiment will be described, focusing on points different from the above-described first embodiment. In addition, in a similar configuration, the same reference numerals are used, and the description of similar items will be omitted.

As illustrated in FIG. 11, the upper electrode 20g according to the fourth embodiment is connected to a supporting portion 26g provided with a fixing portion 32 at an end portion of a direction opposite to the base portion 22, between the adjacent vibration portions 24 which are the vibration node. By the configuration, the fixing portion 32 can be fixed onto the substrate, and the vibration portion 24 of the upper electrode 20g can be separated from the substrate by the supporting portion 26g. In addition, as the supporting portion 26g is connected between the adjacent vibration portions 24 which are the vibration node, it is possible to reduce the deterioration of the Q value due to the vibration leakage, and to provide a MEMS vibrator 100 having a high Q value. In addition, as there are plural supporting portions 26g, it is possible to improve impact resistance, and to provide a MEMS vibrator 100 having excellent impact resistance and a high Q value.

Oscillator

Next, an oscillator 200 which employs the MEMS vibrator 100 as the oscillator according to the embodiment of the invention will be described based on FIG. 12.

Figure 12:
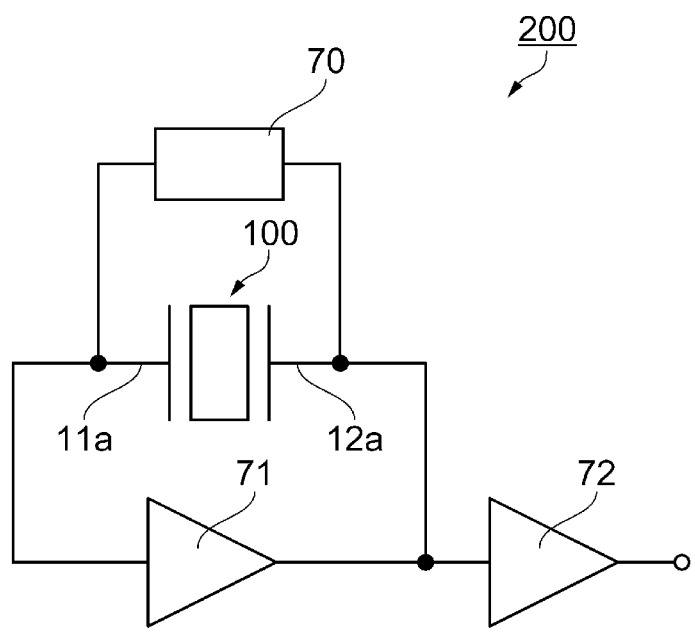
FIG. 12 is a schematic view illustrating a configuration example of an oscillator provided with the vibrator according to the embodiment.

FIG. 12 is a schematic view illustrating a configuration example of the oscillator provided with the MEMS vibrator 100 according to the embodiment of the invention. The oscillator 200 is configured to have the MEMS vibrator 100, a bias circuit 70, amplifiers 71 and 72, or the like.

The bias circuit 70 is a circuit which is connected to the wirings 11a and 12a of the MEMS vibrator 100, and applies the AC voltage in which a predetermined electric potential is biased in the MEMS vibrator 100.

The amplifier 71 is a feedback amplifier which is connected to the wirings 11a and 12a of the MEMS vibrator 100, in parallel with the bias circuit 70. By performing the feedback amplification, the MEMS vibrator 100 is configured as the oscillator 200.

The amplifier 72 is a buffer amplifier which outputs an oscillation waveform.

According to the embodiment, as the MEMS vibrator 100 having a high Q value is provided as the oscillator 200, it is possible to provide an oscillator 200 having higher functionality.

Electronic Device

Next, an electronic device which employs the MEMS vibrator 100 as an electronic component according to an embodiment of the invention will be described based on FIGS. 13A and 13B, and 14.

Figure 13A:
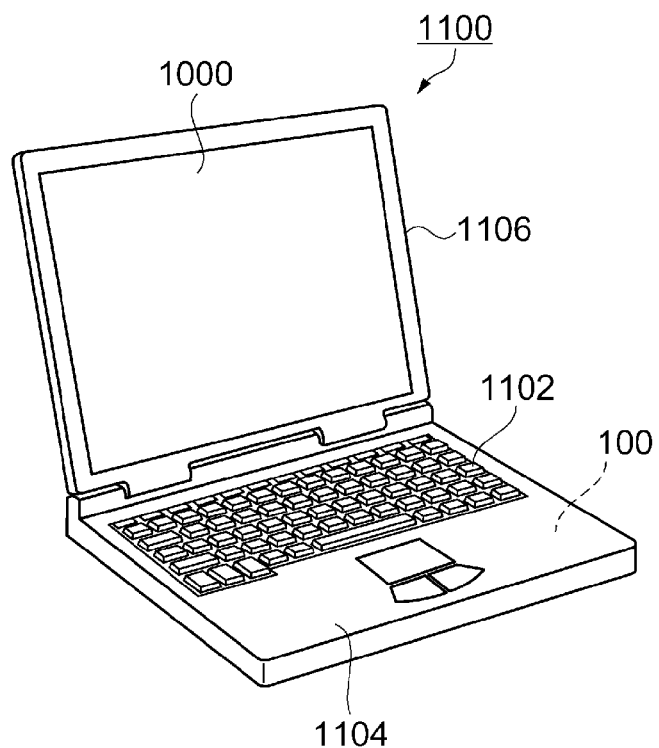
FIG. 13A is a perspective view illustrating a configuration of a mobile type personal computer as an example of an electronic device.

FIG. 13A is a schematic perspective view illustrating a configuration of a mobile-type (or note-type) personal computer as the electronic device provided with the electronic component according to the embodiment of the invention. In the drawing, a personal computer 1100 is configured to have a main body portion 1104 provided with a keyboard 1102 and a display unit 1106 provided with a display portion 1000. The display unit 1106 is supported to be rotatable via a hinge structure portion with respect to the main body portion 1104. In the personal computer 1100, the MEMS vibrator 100 as the electronic component which functions as a filter, a resonator, a reference clock, or the like is embedded.

Figure 13B:
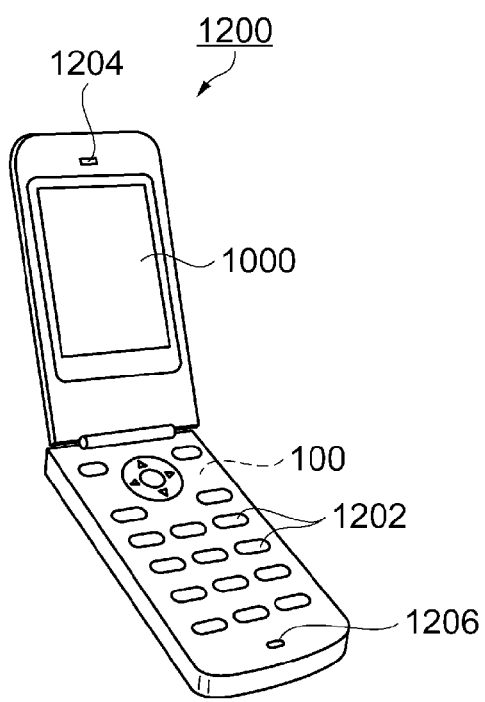
FIG. 13B is a perspective view illustrating a configuration of a mobile phone as an example of the electronic device.

FIG. 13B is a schematic perspective view illustrating a configuration of a mobile phone (including PHS) as the electronic device provided with the electronic component according to the embodiment of the invention. In the drawing, a mobile phone 1200 is provided with a plurality of operation buttons 1202, an ear piece 1204, and a mouth piece 1206. The display portion 1000 is disposed between the operation button 1202 and the ear piece 1204. In the mobile phone 1200, the MEMS vibrator 100 as the electronic component (timing device) which functions as the filter, the resonator, an angular velocity sensor, or the like is embedded.

Figure 14:
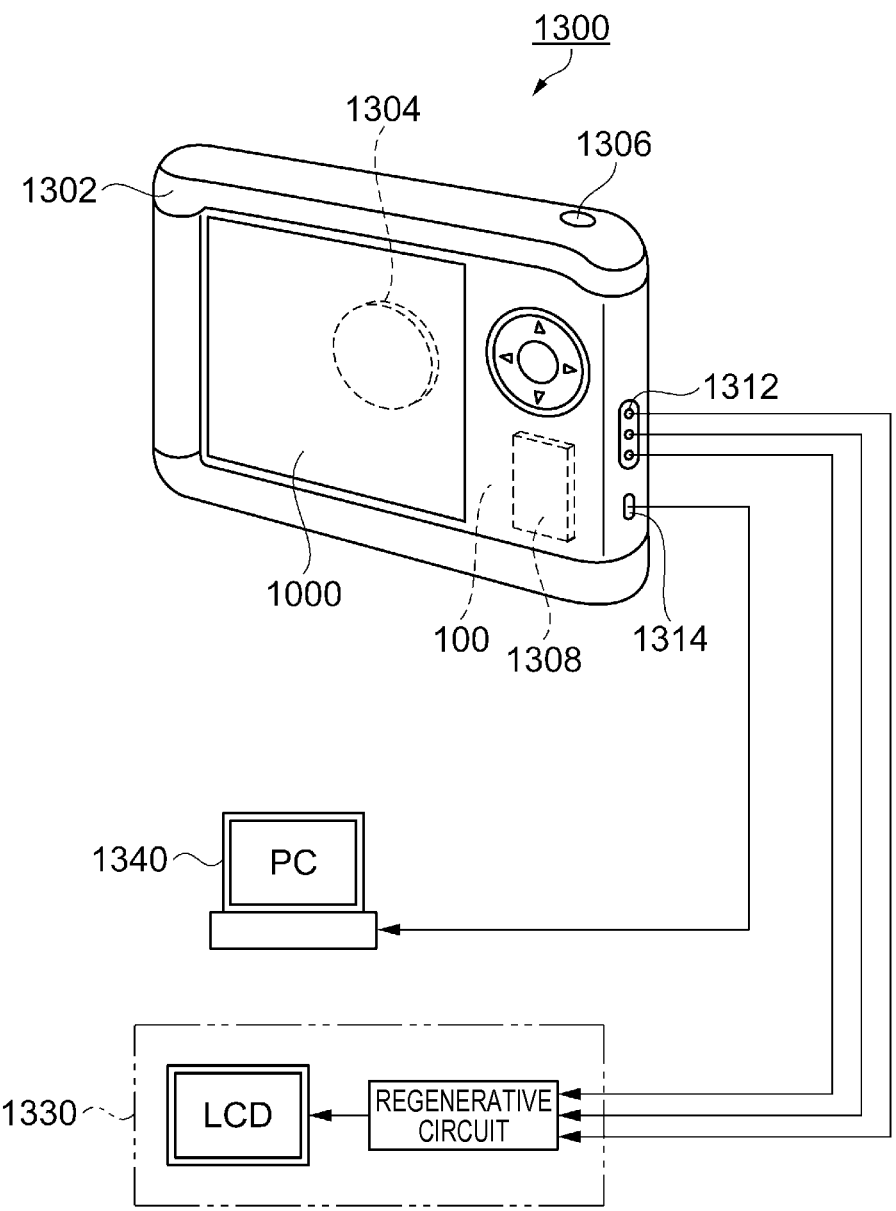
FIG. 14 is a perspective view illustrating a configuration of a digital still camera as an example of the electronic device.

FIG. 14 is a schematic perspective view illustrating a configuration of a digital still camera as the electronic device provided with the electronic component according to the embodiment of the invention. In addition, in the drawing, a connection with an outer device is also simply illustrated. A digital still camera 1300 performs photoelectric conversion of an optical image of a subject by a photographing element, such as a charged coupled device (CCD), and generates a photographing signal (image signal).

On a rear surface of a case (body) 1302 in the digital still camera 1300, the display portion 1000 is provided, and a display is performed based on the photographing signal by the CCD. The display portion 1000 functions as a finder which displays the subject as an electronic image. In addition, on a front surface side (back surface side in the drawing) of the case 1302, a light receiving unit 1304 including an optical lens (photographing optical system) or the CCD is provided.

When a photographer confirms a subject image displayed on the display portion 1000 and pushes a shutter button 1306, the photographing signal of the CCD at that moment is sent and stored in a memory 1308. In addition, in the digital still camera 1300, on a side surface of the case 1302, a video signal output terminal 1312 and a data communication input and output terminal 1314 are provided. As illustrated in the drawing, a television monitor 1330 is connected to the video signal output terminal 1312, and a personal computer 1340 is connected to the data communication input and output terminal 1314, as necessary, respectively. Furthermore, according to a predetermined operation, the photographing signal stored in the memory 1308 is output to the television monitor 1330 or the personal computer 1340. In the digital still camera 1300, the MEMS vibrator 100 as the electronic component which functions as the filter, the resonator, the angular velocity sensor, or the like is embedded.

As described above, as the vibrator (MEMS vibrator 100) having a high Q value is used as the electronic component, it is possible to provide an electronic device having higher functionality.

In addition, the MEMS vibrator 100 as the electronic component according to the embodiment of the invention can be employed in the electronic device, such as an ink jet type discharging apparatus (for example, an ink jet printer), a laptop type personal computer, a television, a video camera, a car navigation apparatus, a pager, an electronic organizer (including an electronic organizer having a communication function), an electronic dictionary, an electronic calculator, an electronic game device, a work station, a video telephone, a television monitor for crime prevention, an electronic binoculars, a POS terminal, a medical device (for example, an electronic thermometer, a sphygmomanometer, a blood sugar meter, an electrocardiograph, an ultrasonic diagnostic equipment, and an electronic endoscope), a fish finder, various measurement apparatuses, meters (for example, meters of the vehicle, an aircraft, or a vessel) or a flight simulator, in addition to the personal computer (mobile type personal computer) in FIG. 13A, the mobile phone in FIG. 13B, and the digital still camera in FIG. 14.

Moving Object

Next, a moving object which employs the MEMS vibrator 100 as the vibrator according to the embodiment of the invention will be described based on FIG. 15.

Figure 15:
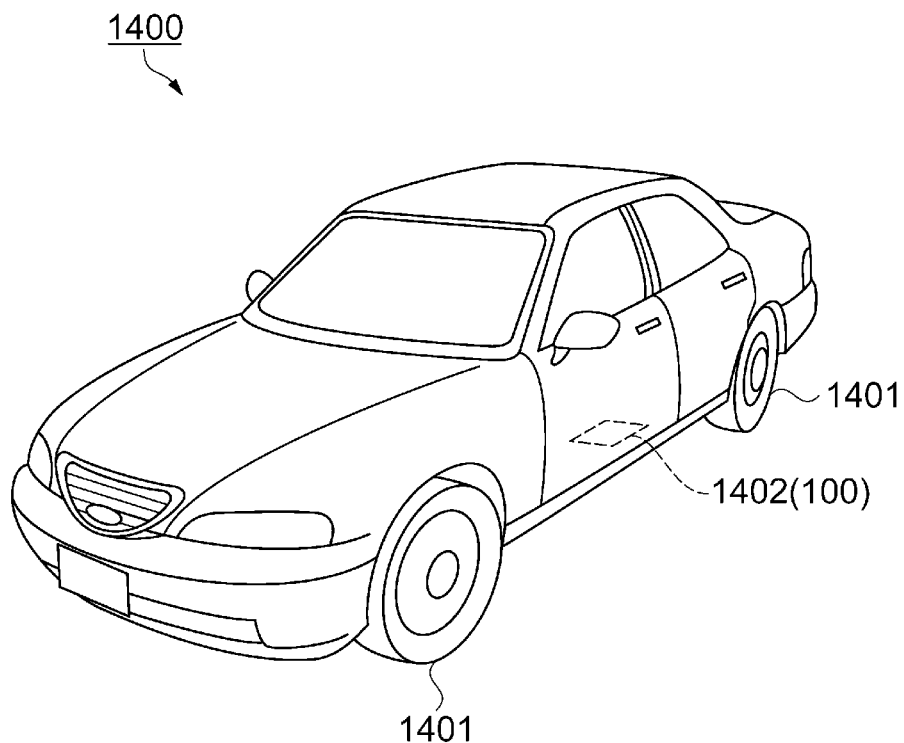
FIG. 15 is a schematic perspective view illustrating a vehicle as an example of a moving object.

FIG. 15 is a schematic perspective view illustrating a vehicle 1400 as the moving object provided with the MEMS vibrator 100. In the vehicle 1400, a gyro sensor configured to have the MEMS vibrator 100 according to the embodiment of the invention is mounted. For example, as illustrated in FIG. 15, in the vehicle 1400 as the moving object, an electronic control unit 1402, in which the gyro sensor that controls a tire 1401 is embedded, is mounted. In addition, as another example, the MEMS vibrator 100 can be employed widely in an electronic control unit (ECU), such as a keyless entry, an immobilizer, a car navigation system, a car air conditioner, an anti-lock brake system (ABS), an air bag, a tire pressure monitoring system (TPMS), an engine control, a battery monitor of a hybrid vehicle or an electric vehicle, or a vehicle posture control system.

As described above, as the vibrator (MEMS vibrator 100) having a high Q value is used as the moving object, it is possible to provide a moving object having higher functionality.

In the above, the vibrator (MEMS vibrator 100), the oscillator 200, the electronic device, and the moving object of the embodiment of the invention are described based on the embodiments illustrated in the drawings. However, the invention is not limited thereto, and the configuration of each part can be replaced with an arbitrary configuration having similar functions. In addition, in the invention, another arbitrary component may be added. In addition, each of the above-described embodiments may be suitably combined.

The entire disclosure of Japanese Patent Application No. 2013-214422, filed Oct. 15, 2013 is expressly incorporated by reference herein.

What is claimed is:

1. A vibrator, comprising:
   a substrate;
   a base portion which is disposed above the substrate;
   a vibration portion which extends in a direction that intersects with a normal line of the substrate from the base portion; and
   a plurality of electrodes which each face one of the base portion and vibration portion, wherein the electrodes are disposed between the substrate and the base portion or the substrate and the vibration portion, and the plurality of electrodes are separated by a separation portion, wherein, in a planar view of the substrate, when a length of the vibration portion in a direction in which the vibration portion extends from the base portion is L, and a length of the vibration portion in a direction that intersects with a direction in which the vibration portion extends from the base portion is W, a dimension ratio (L/W) of the vibration portion satisfies a relationship in which $0.2 \leq (L/W) \leq 7.0$, and wherein four vibration portions extend in a radial shape from the base portion.

2. The vibrator according to claim 1,
wherein the dimension ratio (L/W) satisfies a relationship in which $0.5 \leq (L/W) \leq 1.0$.

3. The vibrator according to claim 1,
wherein the dimension ratio (L/W) satisfies a relationship in which $0.62 \leq (L/W) \leq 0.8$.

4. The vibrator according to claim 1,
wherein the L dimension of the vibration portion is within a range of $5.0 \mu m \leq L \leq 15.0 \mu m$, and the length T of the vibration portion in a direction that intersects the substrate is within a range of $1.0 \mu m \leq T \leq 2.0 \mu m$.

5. The vibrator according to claim 1,
wherein a curved surface is provided between adjacent vibration portions.

6. The vibrator according to claim 1,
wherein the W dimension of the vibration portion is smaller at an end portion on a tip end of the vibration portion than at an end portion on the base portion.

7. An oscillator, comprising:
the vibrator according to claim 1.

8. An electronic device, comprising:
the vibrator according to claim 1.

9. A moving object, comprising:
the vibrator according to claim 1.

* * * * *